United States Patent [19]

Fraas

[11] Patent Number: 4,575,577

[45] Date of Patent: * Mar. 11, 1986

[54] TERNARY III-V MULTICOLOR SOLAR CELLS CONTAINING A QUATERNARY WINDOW LAYER AND A QUATERNARY TRANSITION LAYER

[75] Inventor: Lewis M. Fraas, Albany, Calif.

[73] Assignee: Chevron Research Company, San Francisco, Calif.

[*] Notice: The portion of the term of this patent subsequent to Sep. 13, 2000 has been disclaimed.

[21] Appl. No.: 499,080

[22] Filed: May 27, 1983

[51] Int. Cl.$^4$ ............... H01L 31/06; H01L 31/18
[52] U.S. Cl. ........................... 136/249; 136/262; 148/174; 148/175
[58] Field of Search ............ 136/249 TJ, 262; 148/174, 175; 357/30, 52

[56] References Cited

U.S. PATENT DOCUMENTS

| | | | |
|---|---|---|---|
| 3,993,506 | 11/1976 | Moon | 136/262 |
| 4,404,421 | 9/1983 | Fraas | 136/249 |

OTHER PUBLICATIONS

R. L. Moon et al., Conf. Record, 13th *IEEE Photovoltaic Specialists Conf.* (1978), pp. 859–867.

*Primary Examiner*—Aaron Weisstuch
*Attorney, Agent, or Firm*—D. A. Newell; E. J. Keeling; A. Stephen Zavell

[57] ABSTRACT

Two- and three-terminal ternary III-V two-color and three-color solar cells which incorporate $GaAs_{1-x-y}P_xSb_y$ transparent window layers are described. The window layers lower the surface recombination of the incident homojunction layer.

20 Claims, 6 Drawing Figures

TERNARY III-V MULTICOLOR SOLAR CELLS CONTAINING A QUATERNARY WINDOW LAYER AND A QUATERNARY TRANSITION LAYER

This invention relates to photovoltaic cells. More specifically, this invention relates to ternary III-V multicolor solar cells.

BACKGROUND OF THE INVENTION

Photovoltaic cells such as silicon or III-V compound solar cells are capable of converting solar radiation into usable electrical energy. The electrical energy conversion occurs as a result of what is well known in the solar cell field as the photovoltaic effect. Solar radiation impinging on a solar cell is absorbed by the semiconductor layer, which generates electrons and holes. The electrons and holes are separated by a built-in electric field, for example, a rectifying junction such as a PN junction in the solar cell. The electrons flow towards the N-type region and the holes flow towards the P-type region. The separation of the electrons and holes across the rectifying junction results in the generation of an electric current known as the photocurrent and an electric voltage known as the photovoltage.

Photovoltaic researchers have been investigating various paths toward the generation of electricity from sunlight on an economic basis which can compete with conventional means of generating electricity. The research has focused mainly on two alternatives for economically making electricity from solar cells. For the first alternative, researchers are trying to make low-cost noncrystalline solar cells, such as amorphous silicon cells, and thereafter deploy the cells as large area flat plate arrays. For the second alternative, researchers use a plastic lens as the large area collector in combination with smaller but higher efficiency solar cells. The lens (or array of lenses) focuses the sunlight onto the small area single crystal solar cell (or array of solar cells). This invention focuses on improved high efficiency single crystal solar cells for the second alternative although if the materials costs were lowered, the cell could be used in the first alternative. To date, the solar cells with the highest conversion efficiencies have been fabricated from the III-V compound semiconductor material, GaAs.

Multicolor solar cells, i.e., cells which absorb light at two or more wavelengths in two or more materials, promise still higher conversion efficiencies. Multicolor solar cells have been described in various U.S. patents such as U.S. Pat. No. 4,017,332; U.S. Pat. No. 4,179,702; and U.S. Pat. No. 4,128,733; and in various technical publications such as the Fifteenth IEEE Photovoltaic Specialists Conference, 1981, pp. 1289-1293.

Multicolor solar cells are formed from various semiconductors each containing a light sensitive junction and each semiconductor material is sensitive to a different portion of the solar spectrum. The simplest, lowest cost multicolor cell is formed by growing these various layers in succession as a stack of single crystal films on a single crystal wafer.

Devices have been fabricated with $Al_{1-x}Ga_xAs_ySb_{1-y}$, $Al_{1-x-y}Ga_xIn_yAs$, or $Ga_{1-x}In_xAs_yP_{1-y}$ material systems employing vertical lattice matching with, for example, $GaAs_{1-x}Sb_x$, $Ga_{1-x}In_xAs$, and $Al_{1-x}Ga_xAs_{1-y}Sb_y$, $Ga_{1-x}In_xP$, respectively.

The growth systems used to fabricate these devices have employed rapid layer growth via liquid phase epitaxy systems (LPE) or metal-organic chemical vapor deposition systems (CVD) operating at 1 atmosphere total pressure.

The Al containing compounds when incorporated into active layers of the cell exhibit stability problems when exposed to ambient conditions. Al has an affinity for oxygen and carbon incorporation. This makes oxygen and carbon impurity incorporation a problem during film growth and it makes the final cells containing Al in the active incident layers less stable in outdoor deployment in moist air.

Growth of the $Ga_{1-x}In_xAs_{1-y}P_y$ compound by metal organic CVD has experienced chemical problems resulting from the indium metal organic transport agent, triethyl indium (TEIn). One problem is that TEIn has a very low vapor pressure, making it difficult to supply to the growth zone. A second problem with TEIn is that it reacts prematurely at room temperature with $AsH_3$ and $PH_3$. The resultant compound, formed by alkane elimination, is not volatile. These problems make it difficult to work with the GaInAsP system.

U.S. Pat. No. 4,278,474 describes using Si, GaAsP and GaAs/GaAsP superlattices. However, this system suffers from two problems. First, large lattice mismatch, and second, very large thermal expansion coefficient mismatch. The lattice mismatch is about 4%. Superlattices have been fabricated to solve the first problem. However, the problem of thermal mismatch is more difficult to solve. The GaAsP layer grown on Si is in thermal equilibrium at the growth temperature; when cooled, it shrinks much more than does the silicon substrate. The result is a cracked GaAsP layer which ruins the solar cell.

In many previous applications U.S. Ser. No. 352,680 filed Feb. 26, 1982, now U.S. Pat. No. 4,404,421, and U.S. Ser. No. 424,937 filed Sep. 25, 1982, now U.S. Pat. No. 4,451,691, both of said patents completely incorporated herein by reference, I taught and claimed two- and three-terminal ternary III-V compound multicolor solar cells and a process of fabrication. Although a major advance in multicolor solar cells, these cells could be further improved if the incident layer incorporated a window layer which reduced the surface recombination losses of the cell. A further improvement would also include a window and/or transition layer between the $GaAs_{1-y}Sb_y$ layer and the $GaAs_{1-x}P_x$ layer to further lower interface recombination losses between the active homojunction layers and reduce lattice mismatch strain.

Thus, it would be highly desirable to have the ternary III-V compound semiconductor material systems of my previous applications further including window layers to reduce the incident recombination losses and losses between active homojunction layers. Furthermore, it would be desirable to have these window layers lattice match the active layers to within ±1%. In addition, it would be a desirable option to have a multicolor cell which can incorporate transition layers to reduce the mismatch strain between the active layers.

SUMMARY OF THE INVENTION

These and other desirable properties are incorporated into my multicolor solar cell and process of fabrication invention. The invention utilizes $Al_{(z)}Ga_{(1-z)}As_{(1-x)}P_{(x)}$ semiconductor alloy as a window layer to $GaAs_{(1-x)}P_{(x)}$. The alloys have bandgap energies which are transparent to solar radiation with wavelengths in the range of from about 0.4 to about 1.5 microns, μm. This wide bandgap material forms a suitable window layer and lowers the surface recombination losses of the GaAs$_{1-x}$P$_x$ layer. Since the window layer is not an active region, degradation of the Al by oxidation only increases the bandgap of the layer and improves its performance.

Two- and three-color cells can be fabricated which incorporate the window layer. The two-color cell comprises homojunction layers of GaAs$_{1-y}$Sb$_y$ for the low bandgap cell and GaAs$_{1-x}$P$_x$ for the high bandgap cell. The cells can be fabricated on GaAs or Ge substrates. Shorting junctions separate the GaAs$_{1-x}$P$_x$ and GaAs$_{1-y}$Sb$_y$ cells. Suitable shorting junctions can be fabricated with layers of GaAs or Ge of from about 0.0075 micron, i.e., 75 Å, to about 0.1 micron thick. Optionally, the shorting junction can be heavily doped Al$_z$Ga$_{(1-z)}$-As and/or Al$_{(z)}$Ga$_{(1-z)}$As$_{(1-y)}$Sb$_{(y)}$ as a passivation window transition layer between the GaAs$_{(1-x)}$P$_{(x)}$ and GaAs$_{(1-y)}$Sb$_{(y)}$ layers. The two-color cells can be fabricated with two or three terminals contacting the active layers.

Three-color cells are fabricated with GaAs$_{1-y}$Sb$_y$ for the low bandgap, GaAs for the mid bandgap, and GaAs$_{1-x}$P$_x$ for the high bandgap cells. Each homojunction layer is separated by a shorting junction and optionally a window passivation layer. This construction limits lattice mismatch at each stage between layers to about ±1%. The light sensitive junctions are within the layers and thus removed from mismatch interfaces. The top window layer and intermediate window layer do not contain light sensitive junctions.

DETAILED DESCRIPTION OF THE INVENTION

Figure 1:
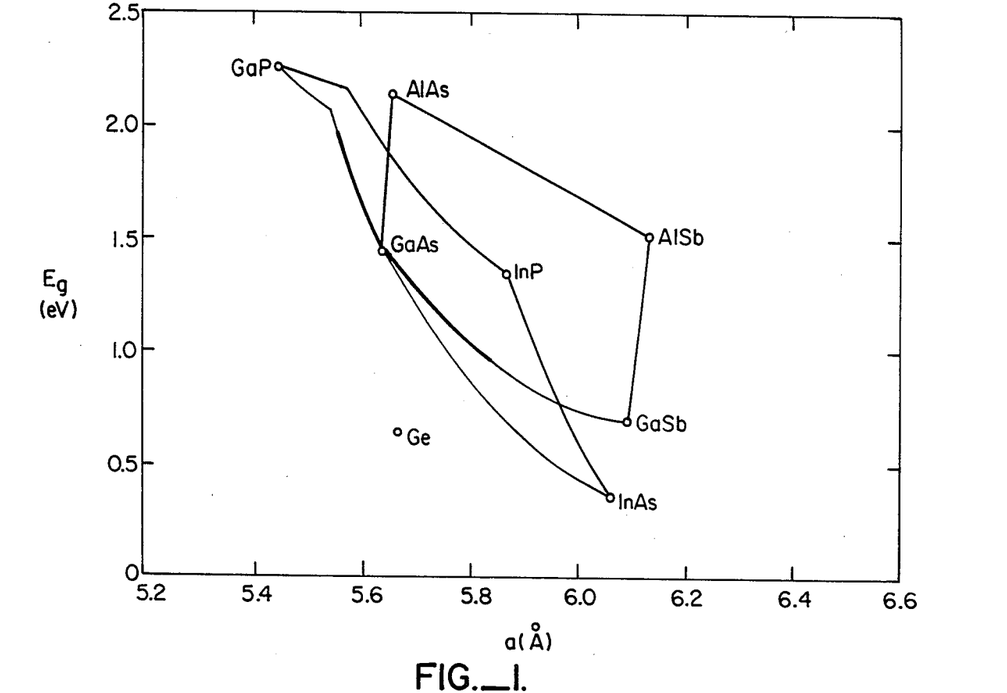
FIG. 1 illustrates the GaAs$_{1-x-y}$Sb$_y$P$_x$ semiconductor alloys.

FIG. 1 illustrates the GaAs$_{1-x-y}$Sb$_y$P$_x$ semiconductor alloys described herein. Plotted is the lattice constant vs. bandgap energy for III-V semiconductor alloys and germanium (Group IV). The GaAs$_{1-x-y}$S-b$_y$P$_x$ alloys are highlighted by the heavy solid line. For x and y ≦0.4, the bandgap energies of the semiconductor alloys span the range from about 0.95 eV to about 1.9 eV. The breadth of the possible bandgap energies makes these semiconductor alloys ideally suited for fabricating two- and three-color concentrator solar cells. The Al containing derivatives of the alloys used in the semiconductor homojunction layers are ideal because the lattice constant (x-axis) remains constant while the bandgap energy (y-axis) is much larger than the active layer. This makes the Al containing alloys transparent window layers which lower the surface recombination losses of the active layers.

Figure 2:
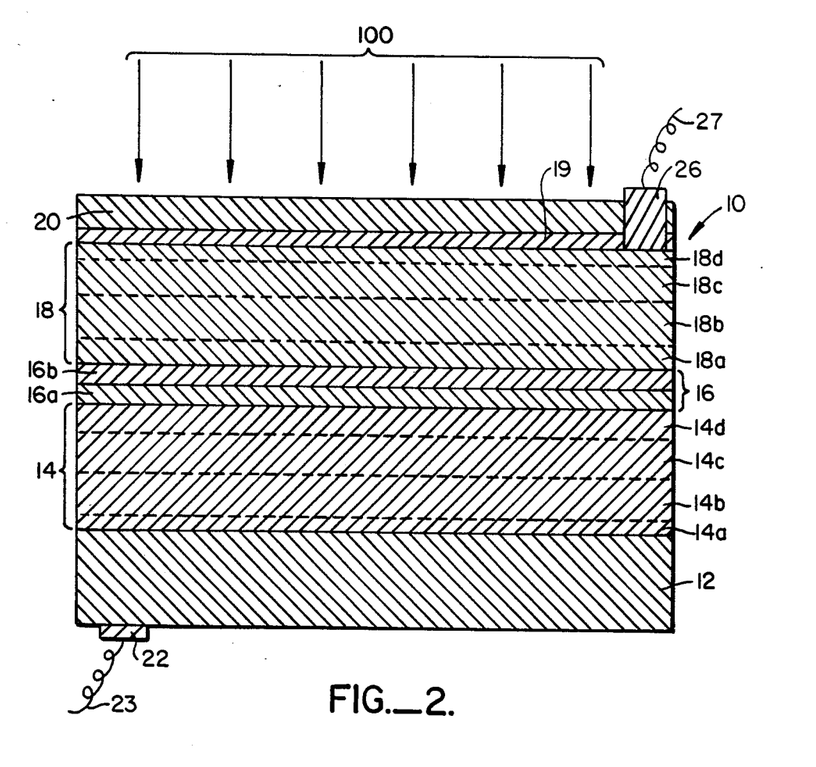
FIG. 2 illustrates a cross-sectional view of a two-color III-V compound photovoltaic cell incorporating an incident window passivation layer of Al$_{(z)}$Ga$_{(1-z)}$-As$_{(1-x)}$P$_{(x)}$ contacting an incident active layer of GaAs$_{(1-x)}$P$_{(x)}$.

A two-color solar cell incorporating my invention is illustrated as solar cell 10 in FIG. 2. Solar radiation 100 serves as a reference point for the top and bottom of each layer or region. Solar cell 10 has a substrate 12 of crystalline germanium, gallium arsenide or other suitable material. Preferably, the material is single crystal material. The substrate can be either N-type or P-type conductivity. If the substrate is N-type conductivity, then the homojunction layers are NP junctions. Alternatively and for FIGS. 3 and 4, as well, the substrate can be P-type conductivity and the homojunction layers are PN junctions. The substrate 12 can be of P$^+$-type conductivity having a dopant concentration on the order of 1×10$^{18}$ dopant atoms per cubic centimeter (Da/cc) with a suitable P-type conductivity modifier such as zinc, cadmium, magnesium, and the like.

A first homojunction layer 14 of GaAs$_{1-y}$Sb$_y$ is fabricated on substrate 12. The GaAs$_{1-y}$Sb$_y$ layer is lattice matched to the substrate to within about ±1%. I have discovered that when using vacuum metal organic-chemical vapor deposition, MO-CVD, lattice mismatching of up to about ±1% can be tolerated without seriously affecting the overall performance of the solar cell, although as close a lattice match as possible to the lattice constant of the substrate is preferred.

The GaAs$_{1-y}$Sb$_y$ layer 14 has the y value adjusted according to the solar spectrum to maximize energy conversion and to provide a bandgap which is less than the bandgap of any higher bandgap layers such as the top homojunction semiconductor layer 18. Normally, the GaAs$_{1-y}$Sb$_y$ layer is selected to have its major absorptance towards the IR range of the spectrum while the top layer 18 is selected to have an absorptance in the visible and ultraviolet range of the solar spectrum. The y can vary from about 0.08 to about 0.4 and preferably from about 0.2 to about 0.3. For example, a GaAs$_{1-y}$Sb$_y$ layer, wherein y is 0.2, i.e., a layer of GaAs$_{0.8}$Sb$_{0.2}$, has a bandgap energy of about 1.1 electron volts (eV) and is suitable as the low band homojunction layer.

Layer 14 is from about 2.5 μm to about 3.5 μm thick and has regions of differing conductivity 14a, 14b, 14c, and 14d which form a homo PN junction therein. The first region 14a of P$^+$-type conductivity has a dopant concentration of about 6×10$^{18}$ Da/cc and a thickness of about 0.1 to 0.3 μm. The second region 14b of layer 14, has P-type conductivity with a dopant concentration of about 3×10$^{17}$ Da/cc and a thickness of about 2 to 2.5 μm. Region 14b forms a homojunction with the third region 14c of N-type conductivity. Region 14c has a dopant concentration of about 1×10$^{18}$ Da/cc N-type dopant atoms and a thickness of about 0.2 to 0.7 μm. Suitable N-type dopant atoms are selenium, tellurium, or sulfur, and the like. Region 14c is graded to N$^+$-type conductivity in a region 14d. The dopant concentration of region 14d is about 1×10$^{19}$ Da/cc and has a thickness of about 0.04 to 0.08 μm. Region 14d contacts a shorting junction 16 which separates the higher bandgap homojunction layer 18 from the layer 14.

Optionally, the cell 10 can further include a passivating transition window layer of $Al_{(t)}Ga_{(1-t)}As_{(1-y)}Sb_{(y)}$, wherein t can vary from about 0.1 to about 0.9 and y is as previously defined, between layer 14 and shorting junction 16.

The shorting junction 16 can be a germanium layer doped N+-type or P+-type conductivity as taught in my U.S. Pat. No. 4,255,211, incorporated herein by reference or a layer 16 of a material such as GaAs having a region 16a of GaAs doped N+-type conductivity and contacting layer 14 with a second region 16b doped P+-type conductivity of GaAs. The shorting junction layer provides an ohmic contact between the cells and maintains cell crystallinity. A tunnel junction in layer 16 permits the transport of electrons between semiconductor layer 14 and semiconductor layer 18 without the formation of a counter PN junction between region 14d and region 18a which would lower the performance of the overall device 10. The GaAsN+P+-type shorting junction 16 will be on the order of about 0.04 μm thick. If N+-type or P+-type germanium is selected as the shorting junction 16, the layer is only about 0.0050 to about 0.0075 μm thick.

Contacting shorting junction 16 and lattice matching thereto to within about ±1% is a layer 18 of a material having a higher bandgap than the layer 14 such as gallium arsenide phosphide $(GaAs_{(1-x)}P_x)$ having regions of differing conductivity 18a, 18b, 18c, and 18d. The x value can be from about 0.1 to about 0.3 and preferably about 0.2, for a bandgap energy of about 1.65 eV. Gallium arsenide phosphide is a preferred top active layer because it is not affected by ambient weather conditions. This is in contrast to gallium aluminum arsenide which is susceptible to degradation from moist air. In addition, the Group V compounds used to form the layers tend to volatilize and not cause problems with inclusion of second phase defects. Thus, the flow rate of the organometallics does not have to be monitored with extreme precision during the fabrication process.

Region 18a of P+-type conductivity is about 0.1 to 0.3 μm, and preferably about 0.2 μm thick and incorporates P-type conductivity modifiers recited previously in a concentration of about $6 \times 10^{18}$ Da/cc. Region 18b of P-type conductivity is about 2 to 3 μm, preferably about 2.2 μm thick, and has a P-type dopant concentration of about $3 \times 10^{17}$ Da/cc. Forming the PN junction with region 18b is region 18c of N-type conductivity, incorporating N-type conductivity modifiers recited previously to a doping concentration of about $1 \times 10^{18}$ Da/cc. Region 18c is about 0.2 to 0.7 μm and preferably about 0.5 μm thick. Finally, semiconductor layer 18 has a region 18d of N+-type conductivity about 0.1 μm thick with a dopant concentration of about $1 \times 10^{19}$ Da/cc.

A transparent passivation window layer 19 of $Al_{(z)}Ga_{(1-z)}As_{(1-x)}P_x$ reduces the surface recombination velocity of the device contacts layer 18. More specifically, the window layer reduces the excited state carrier recombination at the incident surface of the top cell. The z can vary over the range $0.1 \leq z \leq 0.9$ and the x is defined above. Preferably, z is 0.5. Layer 19 is from about 0.01 μm to about 0.1 μm thick and preferably about 0.05 μm thick. The window layer enhances the overall performance of the cell. An example of a suitable passivation layer is an aluminum gallium arsenide phosphide layer wherein x has the same value as in the layer 18. For example, if layer 18 is $GaAs_{0.8}P_{0.2}$, then layer 19 would be $Al_{0.2}Ga_{0.8}As^{0.8}P^{0.2}$. Also, as previously mentioned, a passivating window layer of $Al_{(t)}Ga_{(1-t)}As_{(1-y)}Sb_{(y)}$ can be placed just above the GaAs $(1-y)Sb_{(y)}$ active layer 14 and below the GaAs shorting junction layer 16. Devices using either layer 19 or $Al_{(t)}Ga_{(1-t)}As_{(1-y)}Sb_{(y)}$, or both, as possible.

The multijunction solar cell 10 is completed with an antireflection coating 20 (optional) and electrical contacts 22 to substrate 12 and 26 to layer 18, respectively. Suitable antireflection coatings are 530 Å and 760 Å thicknesses of $Ta_2O_5$ and $SiO_2$, respectively, and the like. Suitable contact materials are Au:Ge alloys and the like. Wires 23 and 27 withdraw the electrical current generated during illumination of the solar cell with solar radiation 100. The electrical contacts 22 and 26 can either be a single uniform metal layer or a grid electrode. In addition, the cell is normally used with a concentrating lens as illustrated in U.S. Pat. No. 4,255,211.

Figure 3:
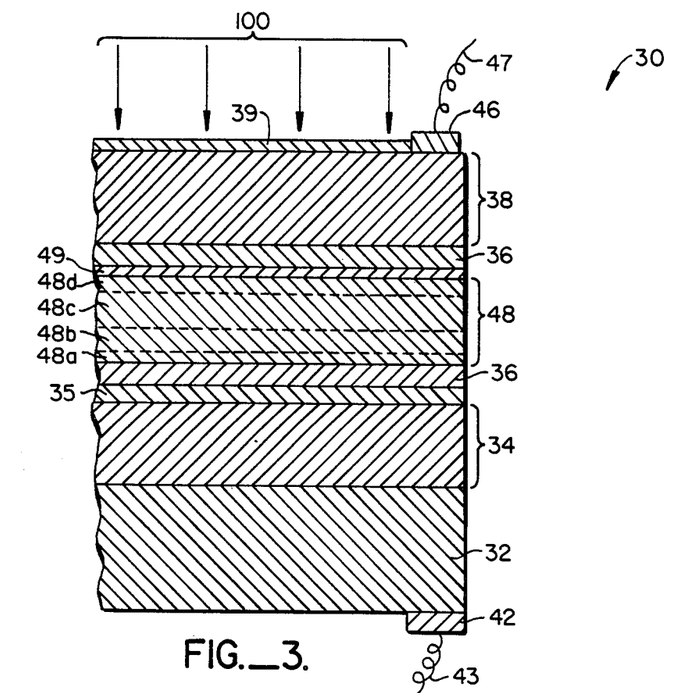
FIG. 3 illustrates a partial cross-sectional view of a three-color III-V compound photovoltaic cell incorporating light sensitive homojunction layers of GaAs$_{1-y}$-Sb$_y$, GaAs, and GaAs$_{1-x}$P$_x$ and Al$_{(z)}$Ga$_{(1-z)}$-As$_{(1-x)}$P$_{(x)}$, Al$_{(s)}$Ga$_{(1-s)}$As and Al$_{(t)}$Ga$_{(1-t)}$As$_{(1-y)}$Sb$_{(y)}$ window passivation layers.

FIG. 3 illustrates a three-color solar cell 30. The substrate 32 corresponds to the substrate 12 in FIG. 2. Layer 34 is the same as layer 14 in FIG. 1. Layer 38 corresponds to layer 18 of FIG. 1; however, the bandgap of the layer 38 is adjusted to about 1.85 eV by setting x equal to about 0.3. Layers 36 correspond to layers 16 in FIG. 1. Layer 39 corresponds to layer 19 in FIG. 1.

Solar cell 30 further incorporates a homojunction GaAs layer 48 separated from layers 34 and 38 by shorting junction layers 36. The layer 48 has a bandgap energy of about 1.45 eV and a thickness of from about 2.5 to about 3.5 μm, and preferably about 3 μm. The layer 48 has regions 48a, 48b, 48c and 48d of P+-type, P-type, N-type and N+-type conductivity, respectively. The regions have comparable thicknesses to layers 36 and 38. The cell 30 also includes window layers 35 and 49 on the incident surface of layers 34 and 48, respectively. Layer 35 is $Al_{(t)}Ga_{(1-t)}As_{(1-y)}Sb_{(y)}$ wherein x is as defined previously and t is $0.1 \leq t \leq 0.9$. Preferably, t is 0.5. Layer 49 is $Al^1_{(s)}Ga_{(1-s)}As$ wherein s is in the range of $0.1 \leq s \leq 0.9$. Preferably, s is 0.5. These window layers 35, 39 and 49 reduce the excited state carrier recombination for active layers 34, 38 and 48, respectively. The values of s, t and z do not have to be equal. The values are adjusted to provide the minimum strain between the layers and the maximum bandgap energy for the layer. The thickness of the layers is adjusted to maximize the transparency of same.

Figure 4:
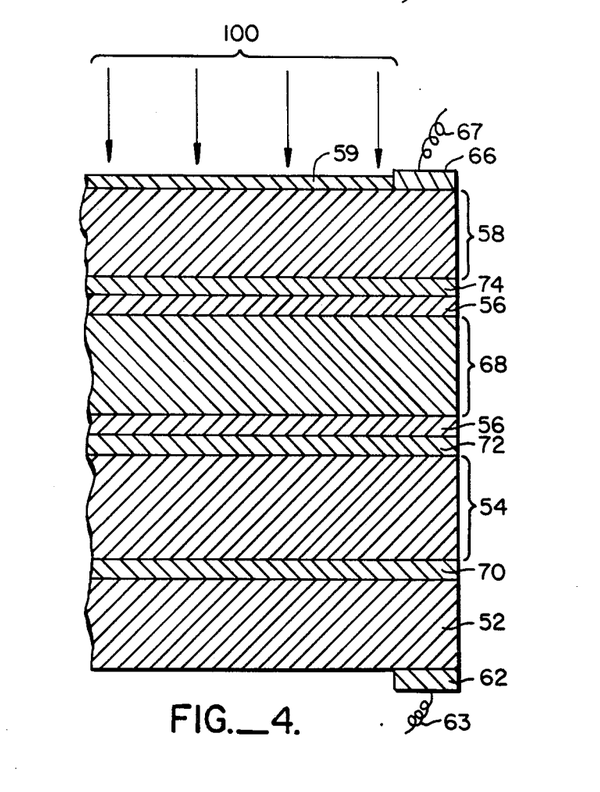
FIG. 4 illustrates a partial cross-sectional view of a three-color III-V compound photovoltaic cell incorporating transition layers between the active homojunction layers.

FIG. 4 illustrates a three-color solar cell 50 which further incorporates transition layers 70, 72, and 74. These transition layers have lattice constants which are intermediate between the active layers and shorting layers. The transition layers reduce lattice strain between the layers. Layers 52, 54, 56, and 58 are the same as layers 32, 34, 36, and 38 of FIG. 3. Layer 68 corresponds to layer 48. Layer 59 corresponds to layers 19 and 39 in FIGS. 2 and 3, respectively. Contacts and wires 62, 63, 66, and 67 correspond to 42, 43, 46, and 47 of FIG. 3. Layers 70 and 72 are of $GaAs_{1-y}Sb_y$ wherein y is less than y in the layer 54. For example, if layer 54 is $GaAs_{0.8}Sb_{0.2}$, then layers 70 and 72 are $GaAs_{0.9}Sb_{0.1}$. The layers 70 and 72 are about 0.02 μm thick. Layers 70 and 72 are P+-type and N+-type conductivity, respectively. Layer 74 is $GaAs_{1-x}P_x$ wherein x is of a lesser value than in layer 58. For example, if layer 58 is $GaAs_{0.8}P_{0.2}$, then layer 74 is $GaAs_{0.9}P_{0.1}$. Layer 74 is about 0.02 μm thick and has a P+-type conductivity.

The exact compositions of layers 70, 72, and 74 are adjusted to minimize defects as the compositions change from $GaAs_{1-y}Sb_y$ through GaAs to $GaAs_{1-x}P_x$.

Figure 5:
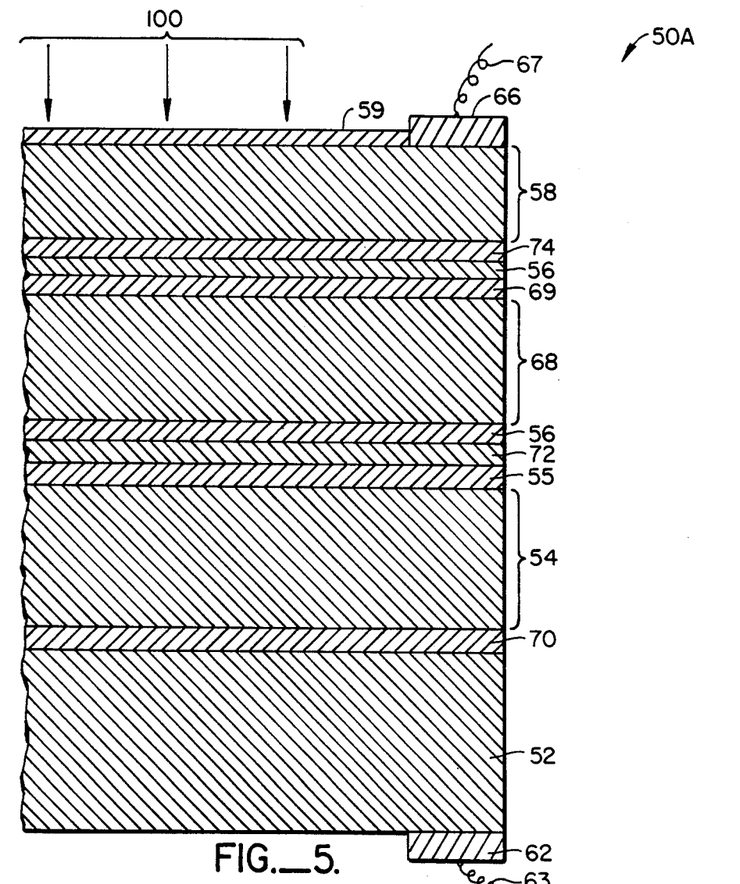
FIG. 5 illustrates a partial cross-sectional view of a three-color III-V compound photovoltaic cell incorporating transition layers, window layers, and shorting junction layers.

FIG. 5 illustrates a solar cell 50A which is similar to solar cell 50 but further incorporates Al containing window layers 55 and 69. Layers 55 and 69 correspond to layers 35 and 49 in FIG. 3. Solar cell 50A has the least amount of strain between the active layers 54, 58 and 68 because the transition layers 70, 72 and 74 and the window layers 55 and 69 are of intermediate lattice constants between the active regions.

Figure 6:
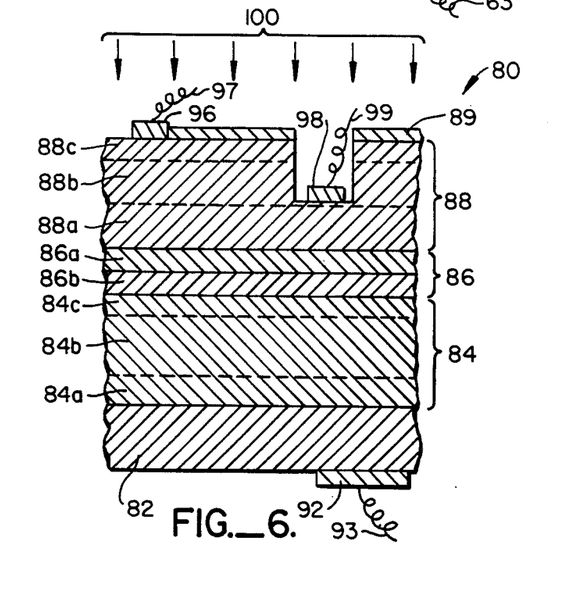
FIG. 6 illustrates a partial cross-sectional view of a three-terminal two-color III-V compound photovoltaic cell incorporating transparent window layers and light sensitive homojunction layers of GaAs$_{1-y}$Sb$_y$ and GaAs$_{1-x}$P$_x$.

FIG. 6 illustrates a partial cross-sectional view of a three-terminal two-color solar cell 80. Solar radiation 100 serves as a reference point for the top and bottom of each layer or region. Solar cell 80 has a substrate 82 of germanium or preferably gallium arsenide. The substrate can be either N-type of P-type conductivity. With a P-type substrate 82, a PNP solar cell is fabricated. With an N-type substrate 82, an NPN solar cell is fabricated. PNP solar cells and NPN solar cells can be connected together in series to overcome the problems of independent load matching as taught by Sakai et al., *J. Appl. Phys.* 51(9), pp. 5018–5024 (1980), incorporated herein by reference. For the purposes of this illustration, the substrate 82 is GaAs doped to an N+-type conductivity and therefore, solar cell 80 is an NPN solar cell. The first homojunction layer 84 of $GaAs_{1-y}Sb_y$ is fabricated on the substrate 82. Y has the same possible values as the y values in the two-color solar cell 10.

The layer 84 has regions of N+-type conductivity 84a, N-type conductivity 84b, and P+-type conductivity 84c. The regions are doped with suitable N-type and P-type dopants and concentrations mentioned previously. The N+-type region 84a is from about 0.5 to about 1.5 μm thick and preferably about 1 μm thick. The N-type region 84b is from about 1.5 to about 3.0 μm thick and preferably about 2.0 μm thick. The P+-type region 84c is from about 0.1 to about 0.3 μm thick and preferably about 0.2 μm thick. The NP homojunction in the layer 84 forms between the regions 84b and 84c.

Fabricated on the layer 84 of $GaAs_{(1-y)}Sb_{(y)}$ is a transition layer 86. A three-terminal solar cell does not require a shorting junction between the homojunctions but only a simple transition layer 86. The layer 86 has a thickness of from about 0.05 to about 0.15 μm and preferably about 0.1 μm. Preferably, layer 86 is a transition layer having two regions 86a and 86b. Region 86b is $Al_{(t)}Ga_{(1-t)}As_{(1-y)}Sb_{(y)}$ about 0.05 μm thick. Region 86b serves as a low interface recombination transparent window for layer 84. Region 86a is an alloy of $Al_{(s)}Ga_{(1-s)}As$ wherein s is in the range of $0.1 \leq s \leq 0.9$. The s does not have to be equal to z or t although this may be preferable in some applications. Region 86a completes the transition layer between layers 84 and 88.

An incident homojunction layer 88 of $GaAs_{1-x}P_x$ is fabricated on the transition layer 86. The layer 88 has the same possible values of x as in the two-color cell illustrated in FIG. 2. The layer 88 has regions 88a, 88b and 88c of P+-type conductivity, P-type conductivity and N+-type conductivity, respectively. The homojunction of layer 88 forms between regions 88b and 88c. Region 88a has a thickness of from about 2.0 to about 4.0 μm and preferably about 3.0 μm. Region 88b has a thickness of from about 1.5 to about 3.0 μm and preferably about 2.0 μm. Region 88c has a thickness of from about 0.05 to about 0.3 μm and preferably about 0.1 μm. A window layer of AlGaAsP similar to layer 19 of FIG. 2 could be used and is beneficial in reducing surface recombination losses.

The solar cell 80 is completed with electrical contacts 92, 96 and 98. Contacts 92 and 96 should be fabricated from materials which ohmically contact N-type materials such as Au:Ge, Ag:Sn, and the like. Contact 98 should ohmically contact the P-type region 88b. The depth of electrode 98 below the incident surface is on the order of from about 2.0 to about 4.0 μm deep. Standard photolithography and etching solutions are used to place electrode 98 into region 88b. Suitable materials are Au:Zn, Au:Be, Ag:Mn, and the like. Wires 93, 97 and 99 withdraw the current generated by the solar cell 80 under illumination with solar radiation 100.

The electrodes 96 and 98 are spaced apart so as to maintain the sheet resistance losses less than or equal to the contact resistance. Therefore, the lower the contact resistance, the farther apart the grid spacings can be fabricated. Suitable electrode spacings for a grid electrode are from about 150 μm to about 400 μm with an electrode width of about 15 μm. Grid shading loss can be reduced by using a grooved cover glass as taught by P. Borden, *Sandia Laboratories Technical Report,* SAND-81-1240, p. 209 (June 1981), incorporated herein by reference. Optionally, solar cell 80 can have passivation layers or antireflection coatings, not shown, on the incident surface of region 88c.

Fabricating the multicolor solar cells 10, 30, 50, 50a and 80 from the $GaAs_{1-x-y}Sb_yP_x$ alloys has many additional processing benefits which are not obvious from the structures. For example, the commercially available metal organics which incorporate antimony have vapor pressures which are orders of magnitude higher than the metal organics incorporating indium. More specifically, triethyl indium (TEIn) has a vapor pressure of about 0.2 torr, whereas trimethyl antimony (TMSb) has a vapor pressure of about 110 torr. The higher vapor pressure facilitates the introduction of Sb into the growth zone. The metal organic of Al, i.e., trimethyl aluminum (TMAl) has a vapor pressure of about 10 torr. This is sufficiently high to avoid the problems encountered with TEIN. In addition, although Al getters carbon and oxygen and thus makes forming pure layers difficult, this is not a problem because Al is not used in any of the active layers of the photovoltaic cell. In addition, the increased volatility of the elements of Column V (i.e., Sb and P) of the Periodic Chart over Column III elements (i.e., In), reduces the possibility of droplets of other deposits of the metal forming on the film as it grows and thus reduces or eliminates inclusions or other damage to the crystalline structure of the layers. Furthermore, indium compounds of metal organics of Column III tend to undergo alkane elimination reactions with arsine at room temperature. This means that more of the materials must be used to grow a given layer and also increases the possibility of contamination of the layer. The method employed by my invention is also more streamlined because all the layers of the solar cell contain gallium and arsenic and hence more uniform films can be grown because fewer gases must be changed during the growth process. With the multijunction cells of my invention, the metal organics of antimony or other Group V materials or phosphorus compounds can be changed by in situ gas sequencing to grow a multicolor, multijunction solar cell. This lowers the cost and shortens the processing time of the solar cell fabricated in comparison to alternate growth systems which require a termination of the growth process after each layer with a cooling of the substrate, exposure to the atmosphere and transportation to a second or third growth chamber for processing of the subsequent layers.

The cell can be fabricated by the process taught in U.S. Pat. No. 4,171,235, incorporated herein by reference or by U.S. Pat. No. 4,290,385, incorporated herein by reference. More specifically, a substrate is placed in a chemical vapor deposition apparatus and the chamber is evacuated to a pressure of about $10^{-7}$ torr. The substrate is heated to a temperature of from about 500° C. to about 650° C. and preferably about 570° C. Thereafter, sources of gallium, arsenic and antimony are opened to a flow rate of about 1 scc/min., 3 scc/min., and 3 scc/min., respectively, for each of said sources. "scc/min." is an abbreviation for a standard cubic centimeter per minute and is defined as the amount of gas occupying one cubic centimeter of volume at standard conditions (1 atm, 20° C.) flowing past a point in one minute. A source of aluminum is operated during the growth to the layers containing the material. During the growth of the aluminum containing layer, the flow rates of the other materials must be suitably adjusted. Generally, the gallium source concentration is reduced when the aluminum source is on. Suitable Al flow rates for TMA1 are from about 0.1 scc/min. to about 0.5 scc/min. A dopant source such as diethyl zinc enters the chamber at a flow rate of about 0.3 scc/min. to create the initial P+ layer and thereafter is slowed to about 0.01 scc/min. to create the P-type region. After growth of the P-type region, the P-type dopant source is turned off and an N-type dopant source is turned on and adjusted to an appropriate flow rate, for example, about 0.1 scc/min., to grow the N-type region of the layer, followed by an increased flow rate, for example, about 0.3 scc/min., for about 1 minute to create an N+ region. A shorting junction of germanium or other suitable material is grown on top of the $GaAs_{1-y}Sb_y$ layer by turning off the gallium, arsenic and antimony sources and passing a source of germanium over layer 14 for about 3 minutes at a flow rate of about 5 scc/min. A top layer of semiconductor material having a larger bandgap than layer 14 such as $GaAs_{1-x}P_x$ is fabricated by methods analagous to that used to fabricate layer 14 or as taught in U.S. Pat. Nos. 4,255,211; and 4,332,974, said patents being incorporated herein by reference.

Finally, a transparent window layer of $Al_{0.5}Ga_{0.5}As_{0.8}P_{0.2}$ can be fabricated by maintaining the As and P concentrations as set for the growth of the $GaAs_{(1-x)}P_{(x)}$ layer and adjusting the Ga source to 0.25 scc/min. and the Al source to 0.25 scc/min. Suitable other layers containing Al can be fabricated by making comparable adjustments. Generally, the Al flow can be from 50% to 200% of the Ga flow. In a three-color cell, the GaAs layer can be fabricated in a comparable procedure.

Preferably, the shorting junction layer and the top layer are fabricated from materials that can also contain gallium and arsenic so that a more uniform process can be effected with only the need to adjust the flow rate of the arsenic, the third element of the ternary compound, to create the larger bandgap top layer 18 and the shorting junction 16. With a GaAs shorting junction, the Ga source can be set at a constant flow rate and only the flow rates of the As and other V elements need be varied to grow the two-color cell. The three-color cell is fabricated by growing a middle homojunction layer of GaAs. Of course, the x and y values can be adjusted by adjusting the flow rates of the compounds containing the elements to obtain any desired bandgap energy of the layers between about 0.90 eV and 1.95 eV.

The three-terminal two-color cell is fabricated in a similar procedure to the steps outlined for two-color and three-color cells. However, the third electrode is formed by standard photolithographic techniques using photomasks and photoresists; exposing the photoresist and developing same and thereafter etching the GaAsP with standard etchants to form the groove for the electrode.

The invention will be more specifically described by referring to the following example. However, it is understood that the invention is not intended to be limited in any way by the following specific example. Modifications which would be obvious to the ordinary skilled artisan, such as fabricating the solar cell with only PN regions for each layer or reversing the junctions to the NP configuration, and the like, are contemplated to be within the scope of the invention. The fabrication could also be accomplished with CVD or LPE, and the like.

EXAMPLE

A P+-type GaAs wafer doped with Zn to $2\times10^{18}$ atoms/cm$^3$ was purchased from Crystal Specialties. The wafer was oriented 2° off the 100 facet toward the 110 direction and was received as cut without polishing. The wafer was scribed and cut so that several square (1.1 cm × 1.1 cm) substrates were obtained. The substrates were mounted on molybdenum blocks with indium solder and polished by known methods such as with a Br-methanol solution as described in *J. Appl. Phys.*, 52, p. 6939 (1981), incorporated herein by reference.

Thereafter, a GaAs substrate was given a brief Br-methanol etch to remove surface contaminants just before loading into a vacuum metal-organic chemical vapor deposition (MO-CVD) machine for the epitaxial layer growths. The MO-CVD equipment has been described previously in the previous article and Fraas, *SPIE Conf. Proc.*, (Jan. 27, 1982), incorporated herein by reference. The gas or vapor sources for Ga, Zn, Sb, As, P, Se, and Al were pure triethyl-Ga (TEGa) (Alfa-Ventron), pure diethyl-Zn (DEZn) (Alfa-Ventron), pure trimethyl-Sb (TMSb) (alfa-ventron), 50% arsine-balance hydrogen (Phoenix), 50% phosphine-balance hydrogen (Phoenix), 500 ppm hydrogen selenide-balance hydrogen (Scientific Gas Products), and pure trimethyl-Al (TMA1) (Alfa-Ventron), respectively. After substrate loading, the deposition chamber was evacuated to $10^{-7}$ torr and the substrate heaters were turned on. The substrate temperature was raised to 610° C. for 15 minutes to flash off oxides. AsH$_3$:H$_2$ (1:1) was introduced during the bake out at a flow rate of 10 scc/min. The substrate temperature was then reduced to the growth temperature of 580° C. and the film growth was started. TEGa and DEZn were introduced simultaneously to grow a P+-type GaAs buffer layer about 0.3 μm thick. The TEGa and DEZn flows were both 0.8 scc/min. TMSb was introduced at a flow rate of 1 scc/min. to grow a P-type $GaAs_{0.9}Sb_{0.1}$ transition layer 0.3 μm thick. The growth time was about 15 minutes. Thereafter, the TMSb flow was increased to 2 scc/min. to grow another P+-type layer 0.3 μm thick. Then the DEZn flow rate was decreased by 0.3 scc/min. to grow a P-type $GaAs_{0.8}Sb_{0.2}$ active layer 2 μm thick. The growth time was about 2 hours. At this point, the DEZn was turned off and shortly thereafter, H$_2$Se (500 ppm in H$_2$) was introduced at a flow rate of 0.2 scc/min. to form an N-type GaAs$_{0.8}$Sb$_{0.2}$ layer and thus form the NP junction of the bottom cell. The N-type layer thickness was 0.5 μm. The growth time was about 30 minutes. Thereafter, the TMSb flow was cut back to 1 scc/min. and a 0.1 μm GaAs0.9Sb0.1 transition layer was grown. The TMSb flow was turned off and a 0.1 μm N-type GaAs transition layer was grown on the GaAs$_{0.9}$Sb$_{0.1}$ transition layer. Then H$_2$:PH$_3$ (1:1) was introduced at a flow rate of 8 scc/min. and the AsH$_3$ flow cut back to 6 scc/min. to grow a GaAs$_{0.9}$P$_{0.1}$ transition layer 0.1 μm thick. The growth of the three transition layers took about 15 minutes. Finally, the AsH$_3$ flow rate was cut back again to 5 scc/min. and the PH$_3$ flow increased to 9 scc/min. A 3 μm thick GaAs$_{0.8}$P$_{0.2}$ N-type layer was grown. The growth time was about 2 hours. Then the H$_2$ Se was turned off and shortly thereafter DEZn was introduced at a flow rate of 1 scc/min. A 0.5 μm thick P$^+$-type GaAs$_{0.8}$P$_{0.2}$ layer was grown. The growth of the layer took about 20 minutes. This layer completed the NP homojunction of the top cell. The growth of the complete cell was completed with a final Al$_{0.5}$Ga$_{0.5}$As$_{0.8}$P$_{0.2}$ window layer grown by reducing the TEGa flow to 0.25 scc/min. and introducing TMAl at 0.25 scc/min. to grow about a 0.04 μm thick window layer. The growth time was about 4 minutes. The flows were stopped and the substrates allowed to cool to room temperature. It is noteworthy that the TEGa and AsH$_3$ gases were flowing without interruption throughout the above deposition sequence and that all the gas flows are microprocessor controlled.

Thereafter, standard photolithography techniques were used to define the finger grid for the top and third electrode. A Shipley AS 1350J resist and Shipley recipes were used to form the top grid pattern on the incident surface of the wafer. The photoresist was about 2 μm thick. The photoresist was exposed and thereafter developed. The developing solution removes the photoresist from the exposed areas, i.e., the top grid lines. Thereafter, the exposed portions on the wafer were etched to remove the AlGaAsP layer in those regions. It was etched with an HF:H$_2$O mixture in a ratio of about 1:20 for about 1 minute. Thereafter, the wafer was dipped into a citric acid peroxide etch for about 30 seconds. The etching mixture was fabricated with 5 parts of solution A comprising a 1:1 mixture of citric acid and H$_2$O and 1 part of solution B comprising a 3:7 mixture of H$_2$O$_2$ to H$_2$O. Finally, a 1 minute etch is concentrated 37% HCl was done on the wafer. Thereafter, 95% silver (Ag) and 5% manganese (Mn) were electron-beam (E-beam) evaporated onto the whole wafer to a thickness of about 0.15 μm. The wafer was then rinsed in acetone until there was no resist left on the wafer. The acetone lifted off the metalization in the areas not contacting the GaAsP layer. This left the alloy grids on the GaAsP layer. The wafer was then put in a tube furnace and heated to 450° C. and maintained at that temperature for 1 minute. The atmosphere in the tube furnace was forming gas. The cell was then re-photoresisted, exposed and developed to remove the photoresist from the grids. The grids were then plated to a thickness of 2 μm with silver in a standard plating bath by Sel-Rex. The wafer was re-coated with photoresist and exposed to form a groove for the third terminal and define all the individual cells on the wafer. The wafer was then etched in an HF etch described above, followed by an etching in HBr:Br:H$_2$O in a ratio of about 17:1:300 for sufficient time to etch below the junction in the GaAsP layer. This was to a depth of about 1.5 to 2 μm. The cell was then re-photoresisted and exposed to a finer grid structure than the width of the grooves previously fabricated in the cell. The cell was then E-beam plated over the whole cell with 0.05 μm of Au:Ge in a ratio of 88 weight percent Au to 12 weight percent Ge, followed by 0.05 μm of nickel (Ni) and then 0.05 μm of Au. The photoresist was stripped with acetone. Thereafter, the wafer was heated in the tube furnace to alloy the grids at 400° C. for 1 minute in a forming gas atmosphere. The wafer was coated with a photoresist for a fifth time and silver was plated onto the Au:Ge/Ni/Au grid to a thickness of 2 μm. The photoresist was stripped and the cell was etched with the HBr etching solution down through the bottom junction of the bottom active layer of GaAsSb so as to define the individual cells. A final photoresist coating was applied and defined to permit the application of a Ta$_2$O$_5$/SiO$_2$ antireflection coating by standard E-beam techniques. The antireflection coating was applied to the entire cell with the exception of the pads onto which wire electrodes are attached. The Ta$_2$O$_5$/SiO$_2$ thicknesses were about 0.053 μm and 0.076 μm, respectively. Wires were connected to the three electrodes and the solar cells. The cells were illuminated with an intensity of 40 suns. The best of the four cells had the following properties: The GaAsP cell had an open circuit voltage ($V_{oc}$) of about 1.1 volt, a fill factor (F.F.) of about 0.80, a short circuit current ($I_{sc}$) of about 16.4 mA/cm$^2$ corrected to 1 sun, and an efficiency of 14.4%. The GaAsSb cell had a $V_{oc}$ of 0.80 volt, $I_{sc}$ of 11.0 mA/cm$^2$, F.F. of 0.75, and an efficiency of about 6.6%. The total efficiency of the device was 21.0%. The other three cells were comparable but slightly lower in efficiency.

What is claimed is:

1. A photovoltaic device comprising:
   a conductive crystalline substrate;
   a layer of GaAs$_{(1-y)}$Sb$_{(y)}$ having regions of differing conductivity forming a homojunction therein contacting said substrate and lattice matching the substrate to within about ±1%;
   a shorting junction layer contacting the surface of said GaAsSb layer opposite to the surface contacting said substrate;
   a layer of GaAs$_{(1-x)}$P$_{(x)}$ having regions of differing conductivity forming a homojunction therein and a larger bandgap than said GaAsSb layer, said GaAs$_{(1-x)}$P$_{(x)}$ layer contacting the surface of said shorting junction layer opposite to said surface contacting said GaAsSb layer;
   a layer of Al$_{(z)}$Ga$_{(1-z)}$As$_{(1-x)}$P$_{(x)}$ contacting a surface of said GaAs$_{(1-x)}$P$_{(x)}$ layer opposite to said surface contacting said shorting junction layer, said Al$_{(z)}$Ga$_{(1-z)}$As$_{(1-x)}$P$_{(x)}$ layer forming a transparent window layer on said GaAs$_{(1-x)}$P$_{(x)}$; and
   means for forming an electrical contact to said layers to withdraw photogenerated current therefrom.

2. The solar cell according to claim 1 wherein y has the value of from about 0.08 to about 0.4 and x has the value of from about 0.1 to about 0.3 and z has the value of from about 0.1 to about 0.9.

3. The solar cell according to claim 2 wherein x and y are about 0.2 and z is 0.5.

4. The solar cell according to claim 2 wherein said shorting junction layer is a GaAs layer having a region of GaAs doped to N$^+$-type conductivity followed by a region of GaAs doped to P$^+$-type conductivity.

5. The solar cell according to claim 2 further comprising means for contacting the GaAsP layer in a region below the homojunction in said layer.

6. The solar cell according to claim 1 wherein said shorting junction layer is an N+-type germanium layer.

7. The solar cell according to claim 1 wherein said shorting junction layer is a P+-type germanium layer.

8. The solar cell according to claim 1, 3, 6, 7 or 4 wherein the GaAsSb layer has a bandgap of about 1.1 eV and the GaAsP layer has a bandgap of about 1.65 eV.

9. The solar cell according to claim 1, 2, 3, or 4 further comprising a GaAs homojunction layer between said $GaAs_{(1-y)}Sb_{(y)}$ and said $GaAs_{(1-x)}P_{(x)}$, said GaAs layer having a bandgap greater than said $GaAs_{(1-y)}Sb_{(y)}$ layer but less than said $GaAs_{(1-x)}P_{(x)}$ layer and separated from said $GaAs_{(1-x)}P_{(x)}$ and $GaAs_{(1-y)}Sb_{(y)}$ layers by shorting junctions.

10. The solar cell according to claim 9 further comprising transition layers between said homojunction layers and said shorting junction layers.

11. A photovoltaic device comprising:
a conductive crystalline substrate;
a layer of $GaAs_{(1-y)}Sb_{(y)}$ having regions of different conductivity forming a homojunction therein and ohmically contacting said substrate and lattice matching said substrate to within about ±1%;
a first shorting junction layer contacting the surface of said GaAsSb layer opposite to the side contacting said substrate;
a layer of GaAs having a homojunction therein contacting said shorting junction layer on the surface opposite to the surface contacting said GaAsSb layer, said GaAs layer having a larger bandgap energy than said $GaAshd (1-y)Sb_{(y)}$ layer;
a second shorting junction layer contacting said GaAs layer opposite to the surface contacting said first shorting junction layer;
a layer of $GaAs_{(1-x)}P_{(x)}$ having regions of differing conductivity forming a homojunction therein contacting the surface of said second shorting junction layer opposite to said surface contacting said GaAs layer, said $GaAs_{(1-x)}P_{(x)}$ layer having larger bandgap energy than either said GaAsSb layer or said GaAs layer;
a layer of $Al_{(z)}Ga_{(1-z)}As_{(1-x)}P_{(x)}$ contacting the surface of said $GaAs_{(1-x)}P_{(x)}$ layer opposite to the surface contacting said second shorting junction layer; and
means for forming electrical contact to said layers to withdraw photogenerated current and voltage therefrom.

12. The solar cell according to claim 11 further comprising transition layers between said homojunction layers and said shorting junction layers.

13. A process of fabricating a multicolor solar cell comprising:
mounting a conductive substrate in a chemical vapor deposition apparatus;
evacuating said apparatus to a pressure of from about $1 \times 10^{-6}$ torr to about $1 \times 10^{-8}$ torr;
heating said substrate to a temperature of from about 500° C. to about 650° C.;
establishing a flow rate of an arsenic containing compound;
establishing a flow rate of a gallium containing compound;
establishing a flow rate of an antimony containing compound;
adjusting the flow rates of said arsenic containing compound and said antimony containing compound and N-type and P-type dopants so as to grow a layer of $GaAs_{(1-y)}Sb_{(y)}$ on said substrate, said layer having a PN homojunction therein;
terminating the flow of said antimony containing compound;
adjusting the flow rate of said arsenic and N-type and P-type compounds so as to grow a first shorting junction on said $GaAs_{(1-y)}Sb_{(y)}$ layer;
increasing the flow rate of said arsenic containing compound while varying the N-type and P-type dopants so as to grow a GaAs homojunction layer on said shorting junction layer;
adjusting the flow rates of said N-type and P-type dopants so as to grow a second shorting junction on said GaAs layer;
decreasing the flow of said arsenic containing compound and introducing a phosphorus containing compound while varying the N-type and P-type dopants so as to grow a $GaAs_{(1-x)}P_{(x)}$ homojunction layer on said second shorting junction layer;
decreasing the flow of said gallium containing compound and establishing a flow of an aluminum containing compound so as to grow a window layer of $Al_{(z)}Ga_{(1-z)}As_{(1-x)}P_{(x)}$ on the incident surface of said $GaAs_{(1-x)}P_{(x)}$ layer;
terminating the flow of said gallium containing compound, said arsenic containing compound, said phosphorus containing compound, said aluminum containing compound and said N-type and P-type dopants; and
removing said substrate from said apparatus and forming an electrical contact thereto.

14. The process according to claim 13 further comprising:
adjusting the flow rates of the antimony containing compound so as to fabricate transition layers of $GaAs_{(1-y)}Sb_{(y)}$ between said substrate and said homojunction layer of $GaAs_{(1-y)}Sb_{(y)}$ and between said homojunction layer and said first shorting junction layer; and
adjusting the flow rate of said phosphorus containing compound so as to grow a transition layer of $GaAs_{(1-x)}P_{(x)}$ between said second shorting junction and said $GaAs_{(1-x)}P_{(x)}$ layer.

15. A photovoltaic device comprising:
a conductive crystalline substrate;
a layer of $GaAs_{(1-y)}Sb_{(y)}$ having regions of differing conductivity forming a homojunction therein contacting said substrate and lattice matching the substrate to within about ±1%;
a shorting junction layer comprising a region of $Al_{(t)}Ga_{(1-t)}As_{(1-y)}Sb_{(y)}$ contacting the surface of said GaAsSb layer opposite to the surface contacting said substrate and a region of $Al_{(s)} Ga_{(1-s)} As$ contacting an overlying layer of $Ga_{(x)}As_{(1-x)}P$;
said layer of $Ga_{(1-x)}P_{(x)}$ having regions of differing conductivity forming a homojunction therein and a larger bandgap than said GaAsSb layer, said $GaAs_{(1-x)}P_{(x)}$ layer contacting the surface of said shorting junction layer opposite to said surface contacting said GaAsSb layer;
a layer of $Al_{(z)}Ga_{(1-z)}As_{(1-x)}P_{(x)}$ contacting a surface of said $GaAs_{(1-x)}P_{(x)}$ layer opposite to said surface contacting said shorting junction layer, said $Al_{(z)}Ga_{(1-z)}As_{(1-x)}P_{(x)}$ layer forming a transparent window layer on said $GaAs_{(1-x)}P_{(x)}$; and means for forming an electrical contact to said layers to withdraw photogenerated current therefrom.

16. A photovoltaic device comprising a conductive crystalline substrate;

a layer of $GaAs_{(1-y)}Sb_{(y)}$ having regions of different conductivity forming a homojunction therein and ohmically contacting said substrate and lattice matching said substrate to within about ±1%.

a first transition layer of $Al_{(t)}Ga_{(1-t)}As_{(1-y)}Sb_{(y)}$ contacting the surface of said GaAsSAb layer opposite to the side contacting said substrate;

a first shorting junction layer contacting the surface of said transition layer opposite to the side contacting said GaAsSb layer;

a layer of GaAs having a homojunction therein contacting said shorting junction layer on the surface opposite to the surface contacting said transition layer, said GaAs layer having a larger bandgap energy than said $GaAs_{(1-y)}Sb_{(y)}$ layer;

a second transition layer of $Al_{(s)}Ga_{(1-s)}As$ contacting the surface of said GaAs layer opposite to the side contacting said shorting junction layer;

a second shorting junction layer contacting said second transition layer opposite to the surface contacting said GaAs layer;

a layer of $GaAs_{(1-x)}P_{(x)}$ having regions of differing conductivity forming a homojunction therein contacting the surface of said second shorting junction layer opposite to said surface contacting said second transition layer, said $GaAs_{(1-x)}P_{(x)}$ layer having larger bandgap energy than either said GaAsSb layer or said GaAs layer;

a layer of $Al_{(z)}Ga_{(1-z)}As_{(1-x)}P_{(x)}$ contacting the surface of said $GaAs_{(1-x)}P_{(x)}$ layer opposite to the surface contacting said second shorting junction layer; and means for forming electrical contact to said layers to withdraw photogenerated current and voltage therefrom.

17. The solar cell according to claim 16 wherein z, s and t are in the range of from 0.1 to 0.9.

18. The solar cell according to claim 17 wherein z, s and t are equal.

19. The solar cell according to claim 18 wherein said GaAsSb layer has a bandgap energy of about 1.1 eV, said GaAs layer has a bandgap energy of about 1.45 eV, and said GaAsP layer has a bandgap energy of about 1.85 eV.

20. A process of fabricating a multicolor solar cell comprising:

mounting a conductive crystalline substrate in a chemical vapor deposition apparatus;

evacuating said apparatus to a pressure of from about $1 \times 10^{-6}$ torr to about $1 \times 10^{-8}$ torr;

heating said substrate to a temperature of from about 500° C. to about 650° C.;

establishing a flow rate of an arsenic containing compound;

establishing a flow rate of a gallium containing compound;

establishing a flow rate of an antimony containing compound;

adjusting the flow rates of said antimony containing compound and said arsenic containing compound so as to fabricate a transition layer of $GaAs_{(1-y)}Sb_{(y)}$ between said substrate and a subsequent homojunction layer of $GaAs_{(1-y)}Sb_{(y)}$;

adjusting the flow rates of said arsenic containing compound and said antimony containing compound and N-type and P-type dopants so as to grow a layer of $GaAs_{(1-y)}Sb_{(y)}$ on said transition layer, said layer having a PN homojunction therein;

introducing a sufficient amount of an aluminum containing compound so as to grow an aluminum containing passivating window layer between said homojunction layer and a subsequently deposited transition layer;

adjusting the flow rates of said antimony containing compound and said arsenic containing compound so as to fabricate a transition layer of $GaAs_{(1-y)}Sb_{(y)}$ between said homojunction layer and a subsequently deposited first shorting junction layer;

terminating the flow of said antimony containing compound;

adjusting the flow rate of said arsenic containing compound and said N-type and P-type dopants so as to grow a first shorting junction on said $GaAs_{(1-y)}Sb_{(y)}$ transition layer;

increasing the flow rate of said arsenic containing compound while varying the N-type and P-type dopants so as to grow a GaAs homojunction layer, having a PN homojunction therein, on said first shorting junction layer;

introducing a sufficient amount of an aluminum containing compound so as to grow an aluminum containing passivating layer between said GaAs homojunction layer and a subsequent by deposited second shorting junction layer;

adjusting the flow rates of said N-type and P-type dopants so as to grow a second shorting junction layer on said aluminum containing passivating layer;

establishing a flow rate of a phosphorus containing compound so as to grow a transition layer of $GaAs_{(1-x)}P_{(x)}$ between said second shorting junction and a subsequently deposited $GaAs_{(1-x)}P_{(x)}$ homojunction layer;

adjusting the flow rates of said arsenic containing compound and said phosphorus containing compound while varying the N-type and P-type dopants so as to grow a $GaAs_{(1-x)}P_{(x)}$ homojunction layer, having a PN homojunction therein, on said second transition layer;

decreasing the flow rate of said gallium containing compound and establishing a flow rate of an aluminum containing compound so as to grow a window layer of $Al_{(z)}Ga_{(1-z)}As_{(1-x)}P_{(x)}$ on the incident surface of said $GaAs_{(1-x)}P_{(x)}$ homojunction layer;

terminating the flow of said gallium containing compound, said arsenic containing compound, said phosphorus containing compound, said aluminum containing compound and said N-type and P-type dopants; and removing said substrate from said apparatus and forming electrical contacts thereto.

* * * * *

UNITED STATES PATENT AND TRADEMARK OFFICE
CERTIFICATE OF CORRECTION

PATENT NO. : 4,575,577
DATED : March 11, 1986
INVENTOR(S) : Lewis M. Fraas

It is certified that error appears in the above–identified patent and that said Letters Patent are hereby corrected as shown below:

Claim 11, Col. 13, Line 36, "GaAshd (1-y)Sb(y)" should read --GaAs(1-y)Sb(y)--.

Signed and Sealed this

Second Day of September 1986

[SEAL]

Attest:

Attesting Officer

DONALD J. QUIGG

Commissioner of Patents and Trademarks